United States Patent
Fukumoto et al.

(10) Patent No.: US 9,245,910 B2
(45) Date of Patent: Jan. 26, 2016

(54) METHOD FOR MANUFACTURING BOARD DEVICE

(71) Applicant: Japan Display Inc., Minato-ku (JP)

(72) Inventors: Yasunori Fukumoto, Minato-ku (JP); Toshihide Jinnai, Minato-ku (JP); Koji Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/547,650

(22) Filed: Nov. 19, 2014

(65) Prior Publication Data
US 2015/0177556 A1  Jun. 25, 2015

(30) Foreign Application Priority Data

Dec. 24, 2013  (JP) ................. 2013-266180

(51) Int. Cl.
H01L 21/77   (2006.01)
H01L 27/12   (2006.01)
G02F 1/1333  (2006.01)
G02F 1/1343  (2006.01)
H01L 29/768  (2006.01)

(52) U.S. Cl.
CPC ...... H01L 27/1259 (2013.01); G02F 1/133345 (2013.01); G02F 1/134363 (2013.01); H01L 29/768 (2013.01)

(58) Field of Classification Search
CPC ............... H01L 2021/775; H01L 27/1214; H01L 27/1259; G02F 2001/1316; G02F 1/13439

See application file for complete search history.

(56) References Cited

U.S. PATENT DOCUMENTS 8,531,637 B2 * 9/2013 Ishiguro ............ G02F 1/134363
349/138

FOREIGN PATENT DOCUMENTS

| JP | 1-103888   | 4/1989 |
| JP | 2006-100715 | 4/2006 |
| JP | 2012-53371 | 3/2012 |

* cited by examiner

Primary Examiner — Daniel Shook
(74) Attorney, Agent, or Firm — Oblon, McClelland, Maier & Neustadt, L.L.P.

(57) ABSTRACT

According to one embodiment, provided is an array substrate that can effectively prevent an oxide conductive film and a silicon nitride film on the oxide conductive film from peeling without deteriorating reliability. A method for manufacturing the array substrate includes a surface treatment step and a nitride film forming step. In the surface treatment step, by plasma discharge, the oxide conductive film is cleaned without being reduced, and surface layers of the insulating film layer not covered by the oxide conductive film and portions of the insulating film layer in the regions covered by the oxide conductive film are etched to form recesses leading to portions under the oxide conductive film. In the nitride film forming step, successively from the surface treatment step, the silicon nitride film is formed by plasma CVD so as to cover the recesses and the oxide conductive film.

8 Claims, 4 Drawing Sheets

| GAS (TOTAL FLOW) | N₂O (3000 sccm) | Ar (2000 sccm) |
|---|---|---|
| PRESSURE | 160 Pa | 220 Pa |
| RF POWER | 0.5 TO 1.5 kW | 1.5 kW |
| INTERELECTRODE DISTANCE | 24 TO 26 mm | 24 mm |
| TIME | 5 TO 15 sec | 15 sec |
| SUBSTRATE TEMPERATURE | 200°C OR MORE | 200°C OR MORE |

METHOD FOR MANUFACTURING BOARD DEVICE

INCORPORATION BY REFERENCE

The present invention claims priority under 35 U.S.C. §119 to Japanese Patent Application No. 2013-266180 filed on Dec. 24, 2013. The content of the application is incorporated herein by reference in its entirety.

FIELD

An embodiment of the present invention relates to a method for manufacturing a board device including an insulating film layer provided on a substrate main body, an oxide conductive film provided on portions of this insulating film layer, and a silicon nitride film provided on this oxide conductive film.

BACKGROUND

Conventionally, on a TFT array substrate being a board device to be used for, for example, a liquid crystal display device, a silicon nitride film (SiN film) that serves as an insulating film may be formed on an ITO (Indium Tin Oxide) film being the oxide conductive film that becomes an electrode. Such a TFT array substrate is subjected to heating and film formation in a vacuum state by using a plasma CVD apparatus.

Generally, when forming a nitride film, it is possible that a mixed gas mainly composed of mono-silane ($SiH_4$) gas and ammonia ($NH_3$) gas is used as a material and a nitride film is formed with a plasma CVD apparatus.

When forming a silicon nitride film on the ITO film, in a deposition chamber of a plasma CVD apparatus, successively after gas pressure regulation, a silicon nitride film is formed. A substrate temperature at this time is preferably in the range from 200° C. to 450° C. for obtaining excellent film quality.

Through this film formation using a plasma CVD apparatus, a highly reliable silicon nitride film can be comparatively easily and efficiently manufactured.

However, in the case where a silicon nitride film is formed on the ITO film by using a plasma CVD apparatus, adhesion between the formed silicon nitride film and the ITO film is weak, and the formed film may easily peel. A possible cause of this lowering in adhesion is that plasma degradation of the silane gas and ammonia gas being material gases lowers adhesion between the ITO film surface and the silicon nitride film.

As a method for improving the adhesion between the ITO film and the silicon nitride film formed on the ITO film, a method in which an oxide film (SiOx film) is formed under the silicon nitride film is known. However, the ITO film or the insulating film layer (flattening film) being a layer under the ITO film is weak in terms of moisture, so that formation of an oxide film may cause a reliability failure. Therefore, the method in which an oxide film is formed under the silicon nitride film is inappropriate.

In addition, in the method in which washing is performed as pretreatment before formation of the silicon nitride film, the insulating film layer that is a layer under the ITO film may absorb moisture and causes the same failure as described above, so that this method is also inappropriate.

Therefore, for keeping adhesion between the ITO film and the silicon nitride film on the ITO film, a method is known in which the film stress of the silicon nitride film is adjusted to avoid peeling of the silicon nitride film. In particular, by using this film stress as a tensile-side stress, peeling of the silicon nitride film can be suppressed.

However, it is not easy to continuously adjust the film stress of the silicon nitride film, and control of the film thickness and stress according to the design of a product is troublesome.

DETAILED DESCRIPTION

A method for manufacturing a board device according to an embodiment is a method for manufacturing a board device that includes a substrate, an insulating film layer provided on this substrate, an oxide conductive film provided on portions of the insulating film layer, and a silicon nitride film provided on the oxide conductive film. This method for manufacturing the board device includes a surface treatment step and a nitride film forming step. In the surface treatment step, by plasma discharge, the oxide conductive film is cleaned without being reduced, and surface layers of the insulating film layer not covered by the oxide conductive film and portions of the insulating film layer in the regions covered by the oxide conductive film are etched to form recesses leading to portions under the oxide conductive film. In the nitride film forming step, successively from the surface treatment step, the silicon nitride film is formed by plasma CVD so as to cover the recesses and the oxide conductive film.

Hereinafter, a constitution of an embodiment is described with reference to the drawings.

Figure 5:
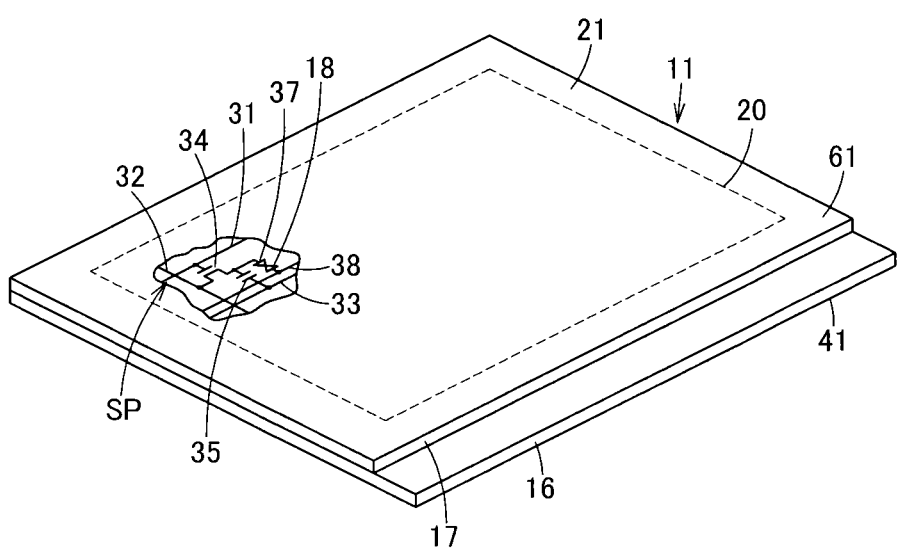
FIG. 5 is a perspective view schematically showing a display device including the same board device.

In FIG. 5, the reference symbol 11 denotes a liquid crystal display device, that is, a liquid crystal panel being an LCD (Liquid Crystal Display), and this liquid crystal panel 11 is, for example, a transmission type that displays images by modulated transmission of planar light from a backlight being a planar light source device not illustrated.

This liquid crystal panel 11 is, for example, an active matrix type capable of performing color display, and for example, in the present embodiment, a constitution to which a mode that switches liquid crystal molecules by mainly using a transverse electric field (electric field substantially parallel to the principal surface of the substrate), such as an IPS mode or an FFS mode, is applied, is described.

This liquid crystal panel 11 is constituted so that an array substrate 16 being a first substrate serving as a board device and a counter substrate 17 being a second substrate are disposed so as to oppose each other via an unillustrated spacer being a gap holding member, a liquid crystal layer 18 being a light modulation layer is interposed between these substrates 16 and 17, and a polarizing plate not illustrated is attached to each of the substrates 16 and 17. In this liquid crystal panel 11, the substrates 16 and 17 are bonded together and f fixed by a seal portion as a bonding portion, a square-shaped display region (active area) 20 including sub-pixels SP formed in a matrix that display images is formed at the substantially center portion, and around this display region 20, a frame portion 21 that has a frame shape and is a non-display region is formed.

The array substrate 16 is a substrate for a liquid crystal display device (for a liquid crystal panel), and is electrically and generally constituted so that the array substrate 16 includes scanning lines (gate wirings) 31 and signal lines (source wirings) 32 being a plurality of wirings in a lattice form in which they are substantially orthogonal to each other in the horizontal direction (H) and the vertical direction (V), and a plurality of auxiliary capacitance lines 33 along the horizontal direction (H), and at each of the intersections of the scanning lines 31 and the signal lines 32, for example, a polysilicon n-channel thin film transistor 34 being a switching element for driving each sub-pixel SP and an auxiliary capacitance (holding capacitance) 35 are disposed in the display region 20. Each scanning line 31 is drawn out to the frame portion 21 and connected to a scanning line driver circuit not illustrated, and each signal line 32 is drawn out to the frame portion 21 and connected to a signal line driver circuit not illustrated. Each auxiliary capacitance line 33 is drawn out to the frame portion 21 and connected to an auxiliary capacitance line driver circuit not illustrated. The gate electrodes 34g of the respective thin film transistors 34 are connected to the scanning lines 31, the source electrodes 34s are connected to the signal lines 32, and the drain electrodes 34d are connected to the pixel electrodes 37. Between these pixel electrodes 37 and a common electrode 38 common to all thin film transistors 34, the liquid crystal layer 18 is interposed. Each auxiliary capacitance 35 is formed between a part of the drain electrode 34d of each thin film transistor 34 and the auxiliary capacitance line 33. Each driver circuit is connected to a drive circuit not illustrated.

Figure 1:
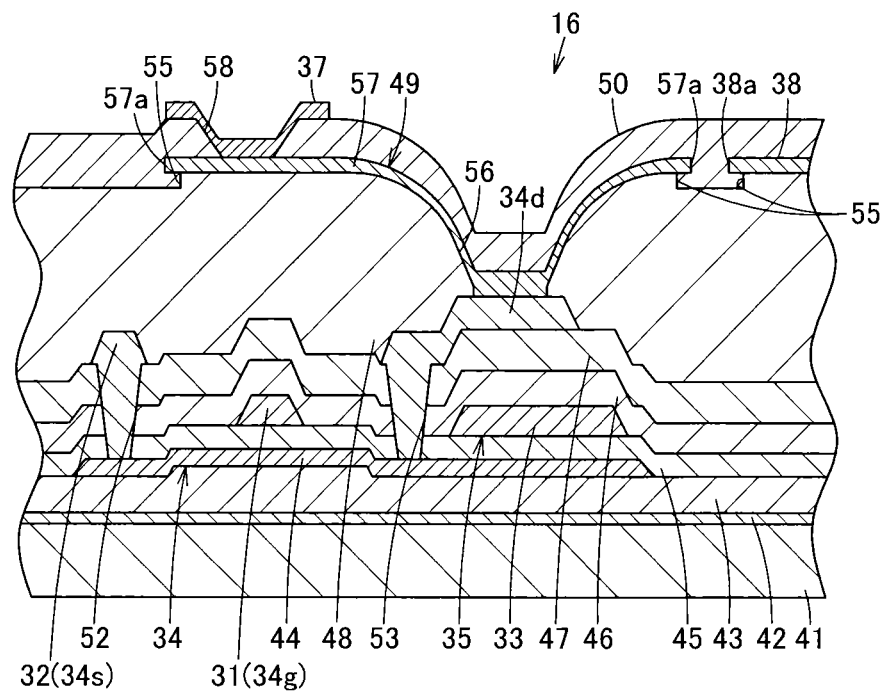
FIG. 1 is a sectional view showing a board device according to an embodiment.

The array substrate 16 structurally includes, as shown in FIG. 1, an array substrate main body 41 being a (first) insulating substrate having translucency as a substrate made of, for example, glass or synthetic resin, etc., and on the surface opposed to the liquid crystal layer 18 (counter substrate 17) which is a principal surface of the array substrate main body 41, a (first) undercoat layer 42 as a (first) insulating film which is, for example, a silicon nitride film, and a (second) undercoat layer 43 as a (second) insulating film which is, for example, a silicon oxide film, are laminated. On this undercoat layer 43, semiconductor layers 44 of the thin film transistors 34 made of, for example, polysilicon (p-Si) are formed. Further, on the undercoat layer 43, a (first) interlayer insulating film 45 which is, for example, a silicon oxide film using TEOS (tetraethoxysilane), etc., is formed so as to cover the semiconductor layers 44. On this interlayer insulating film 45, at positions above the semiconductor layers 44, the scanning lines 31 (gate electrodes 34g) made of, for example, molybdenum-tungsten alloy (MoW), etc., and the auxiliary capacitances 35, etc., are formed. Further, on the interlayer insulating film 45, a (third) insulating film 46 which is, for example, a silicon nitride film, etc., and a (fourth) insulating film 47 which is, for example, a silicon oxide film, etc., are laminated so as to cover the scanning lines 31 and the auxiliary capacitances 35, etc. Further, on this insulating film 47, the signal lines 32 (source electrodes 34s) and drain electrodes 34d, etc., in which, for example, an aluminum-silicon alloy (AlSi), titanium (Ti), and titanium nitride (TiN) are laminated are formed. On the insulating film 47, an insulating film layer (flattening film) 48 made of an organic substance is formed so as to cover the signal lines 32 and the drain electrodes 34d, etc. On this insulating film layer 48, an oxide conductive film 49 is formed. On the insulating film layer 48, a silicon nitride film 50 is formed so as to cover the oxide conductive film 49. On this silicon nitride film 50, the pixel electrodes 37 are formed. On the pixel electrodes 37, an alignment film that aligns liquid crystal molecules is formed although this is not illustrated.

The source regions and the drain regions of the semiconductor layers 44 are electrically connected to the source electrodes 34s and the drain electrodes 34d of the thin film transistors 34 covering contact holes 52 and 53 formed to penetrate the insulating films 45, 46, and 47, and the channel regions of the semiconductor layers 44 are positioned below the gate electrodes 34g of the thin film transistors 34.

The insulating film layer 48 is made of an organic substance, for example, acryl, polyamide, or the like. On the surface of this insulating film layer 48, recesses 55 leading to portions under the oxide conductive film 49 are formed. In this insulating film layer 48, contact holes 56 are formed, and the oxide conductive film 49 covers the contact holes 56 and is electrically connected to the drain electrodes 34d.

The oxide conductive film 49 is made of at least one kind among respective oxides of, for example, indium (In), tin (Sn), and zinc (Zn), in the present embodiment, made of ITO (Indium Tin Oxide), and has translucency (light permeability). This oxide conductive film 49 includes conductive portions, for example, such as the common electrode 38, a relay electrode 57 that covers the contact holes 56 and electrically connects the drain electrodes 34d and the pixel electrodes 37, etc. These common electrode 38 and the relay electrode 57 are spaced from each other and formed in an island-shape, respectively, and the recesses 55 lead to the side under edge portions (end portions) 38a and 57a thereof, respectively. The edge portions 38a and 57a mean not only the outer edge portions of the common electrode 38 and the relay electrode 57 but also portions having surfaces continued across the surfaces and the back surfaces of the common electrode 38 and the relay electrode 57, for example, edge portions of holes opened in the common electrode 38 and the relay electrode 57, etc.

The silicon nitride film 50 is formed to include the recesses 55 and cover the insulating film layer 48 and the oxide conductive film 49. Therefore, the silicon nitride film 50 enter the portions under the edge portions 38a and 57a of the common electrode 38 and the relay electrode 57, etc., of the oxide conductive film 49 at the positions of the recesses 55. In other words, the common electrode 38 and the relay electrode 57 of the oxide conductive film 49 are overhang portions the edge portions 38a and 57a of which overhang with respect to the silicon nitride film 50. In this silicon nitride film 50, contact holes 58 are formed, and the pixel electrodes 37 cover the contact holes 58 and are electrically connected to the relay electrode 57. Therefore, the pixel electrodes 37 are upper layer films of the silicon nitride film 50, and are disposed above the positions including the edge portions 57a of the relay electrode 57.

On the other hand, the counter substrate 17 shown in FIG. 5 includes a counter substrate main body 61 being a (second) insulating substrate having translucency made of, for example, glass, synthetic resin, or the like, and on a surface opposed to the liquid crystal layer 18 (array substrate 16) which is a principal surface of the counter substrate main body 61, a black matrix being a light shielding portion that segments the sub-pixels SP and color filters being coloring portions disposed corresponding to the respective sub-pixels SP are laminated although these are not illustrated. In a liquid crystal mode utilizing the above-described transverse electric field, the surface in contact with the liquid crystal layer 18 of the counter substrate 17 is preferably flat, and via an overcoat layer intended to flatten unevenness of the surfaces of the black matrix and the color filters, an alignment film is laminated.

Next, a manufacturing method according to the above-described embodiment is described.

Figure 2:
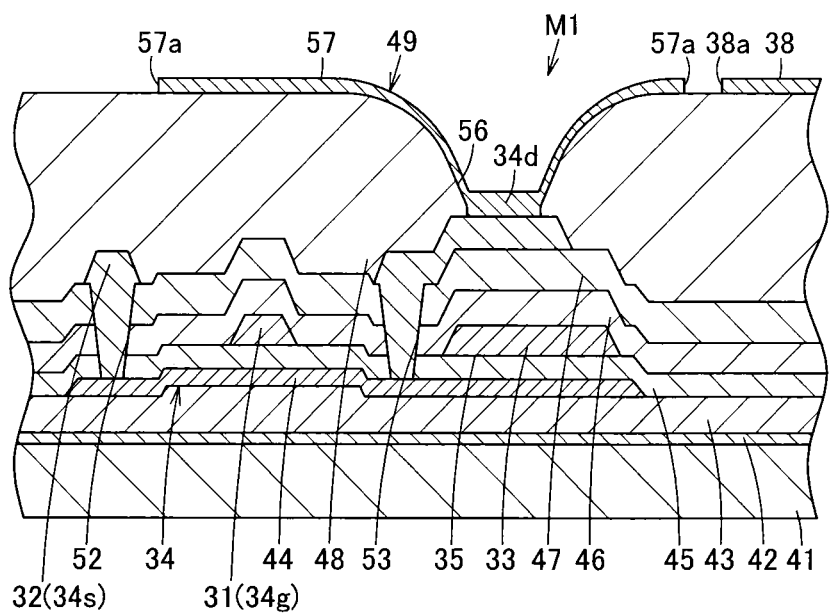
FIG. 2 is a sectional view showing a state before a surface treatment step of the same board device.

To manufacture the array substrate 16, first, as shown in FIG. 2, on the array substrate main body 41, an intermediate body M1 including the undercoat layers 42 and 43, the semiconductor layers 44, the interlayer insulating film 45, the scanning lines 31 (gate electrodes 34g) and the auxiliary capacitance lines 33, the insulating films 46 and 47, the signal lines 32 (source electrodes 34s) and the drain electrodes 34d, and the insulating film layer 48 and the oxide conductive film 49 (the common electrode 38 and the relay electrode 57) formed by repeating the known film formation process and patterning process, etc., is formed.

Figure 3:
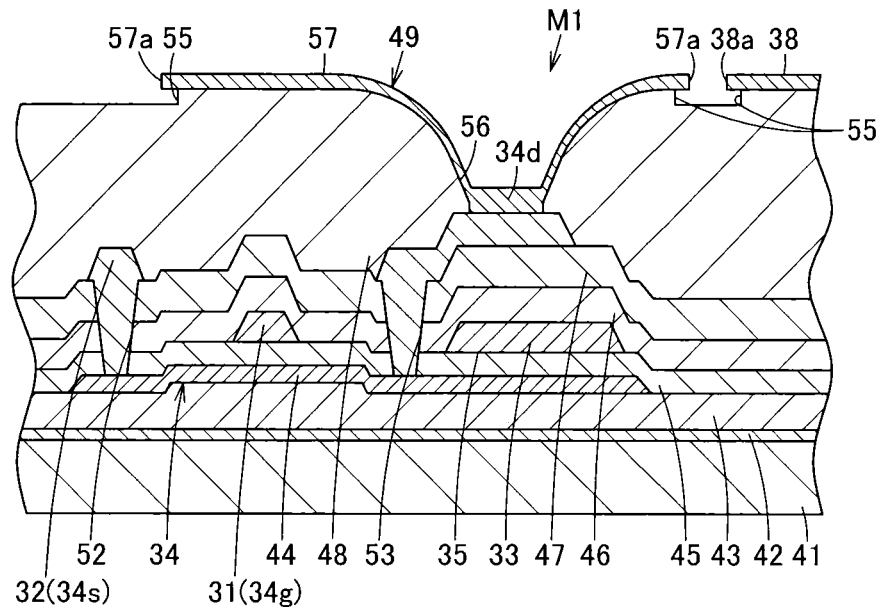
FIG. 3 is a sectional view showing a state after the surface treatment step of the same board device.

Then, by using a plasma CVD apparatus not illustrated, this intermediate body M1 is subjected to pre-heating first, and at least any gas of nitrous oxide ($N_2O$), nitrogen ($N_2$), and argon (Ar) is introduced into a vacuum chamber and the pressure is regulated to a predetermined pressure, and thereafter, by performing plasma discharge in the atmosphere of these, the oxide conductive film 49 is cleaned without being reduced, and surface layers of the insulating film layer 48 not covered by the oxide conductive film 49 and portions of the insulating film layer 48 in the regions covered by the oxide conductive film 49 (the portions under the edge portions 38a and 57a of the common electrode 38 and the relay electrode 57 of the oxide conductive film 49) are etched to form the recesses 55 leading to the portions under the oxide conductive film 49 as shown in FIG. 3 (surface treatment step).

Figure 4:
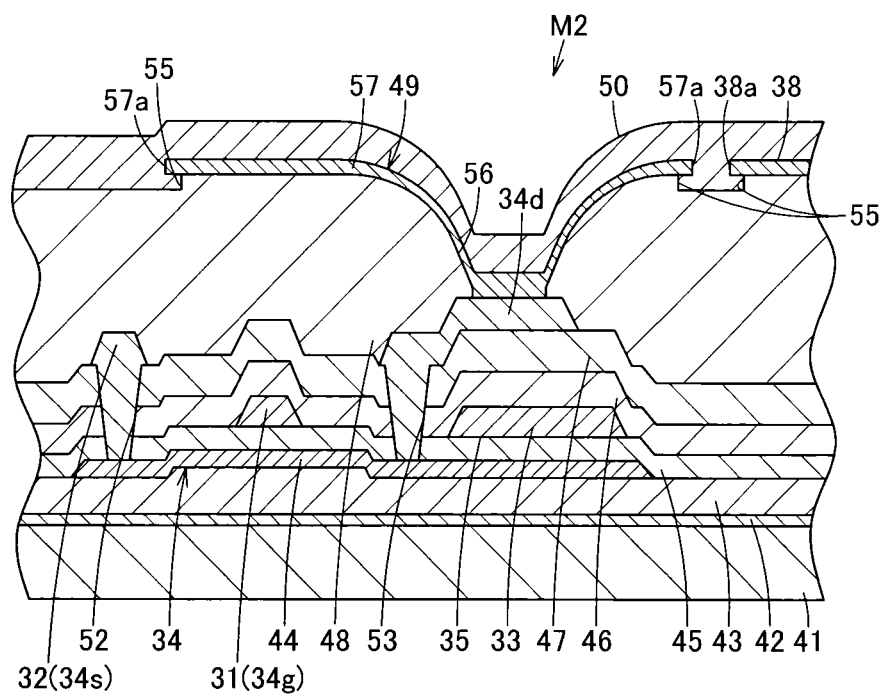
FIG. 4 is a sectional view showing a state after a nitride film forming step of the same board device.

Subsequently, in the vacuum chamber of the plasma CVD apparatus with which the surface treatment step was performed, after the pressure is regulated to the predetermined pressure, by performing plasma treatment, as shown in FIG. 4, an intermediate body M2 in which the silicon nitride film 50 was formed to cover the recesses 55 and the oxide conductive film 49 is formed (nitride film forming step), neutralization of the intermediate body M2 and exhaust ventilation of the apparatus are performed in the same manner as in the case of general plasma CVD, and thereafter, the intermediate body M2 is ejected from the plasma CVD apparatus.

That is, these surface treatment step and nitride film forming step can be performed as a series of steps in the same plasma CVD apparatus. In other words, the surface treatment step described above can be easily realized only by adding pressure regulation and plasma discharge to the normal nitride film forming step.

The scraping amount of the insulating film layer 48 in the surface treatment step is preferably 0.08 μm or less, and more preferably, up to approximately 0.05 μm. Therefore, so as to satisfy this condition, the etching time, the gas total flow, and radio frequency (RF) power are set. The etching time is preferably less than 1 minute, and more preferably, less than 20 seconds. The gas total flow is preferably approximately 2000 sccm to 3000 sccm. Further, the radio frequency power is preferably 0.5 kW to 1.5 kW. The temperature of the intermediate body M1 is preferably 150° C. to 450° C., more preferably, 150° C. to 300° C.

Figures 6, 7:
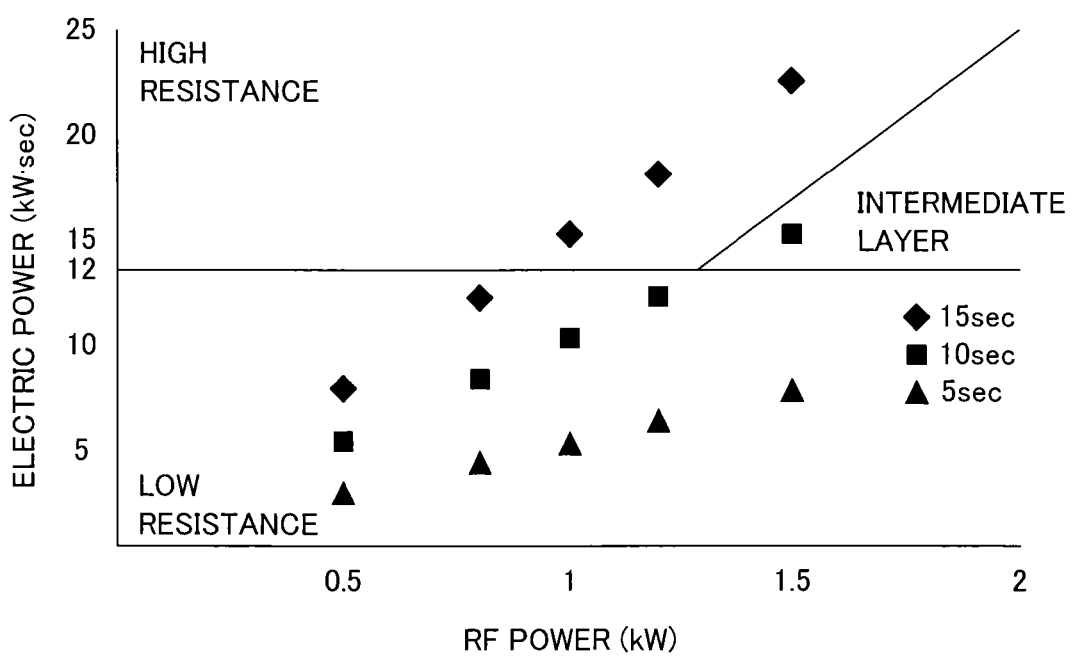
FIG. 6 is a table showing examples of treatment conditions of the surface treatment step to be applied to the same board device.
FIG. 7 is a graph showing an example of a relationship between radio frequency power and electric power in the surface treatment step to be applied to the same board device.

Possible examples of the surface treatment step are an example in which, in a parallel-plate type plasma CVD apparatus, as shown in the table of FIG. 6, nitrous oxide ($N_2O$) is used, the total flow is set to 3000 sccm, the pressure is set to 160 Pa, the radio frequency power is set to 0.5 kW to 1.5 kW, the interelectrode distance is set to 24 mm to 26 mm, the etching time is set to 5 seconds to 15 seconds, and the temperature of the intermediate body M1 is set to 200° C. or more (300° C. or less), and an example in which argon (Ar) is used, the total flow is set to 2000 sccm, the pressure is set to 220 Pa, the radio frequency power is set to 1.5 kW, the interelectrode distance is set to 24 mm, the etching time is set to 15 seconds, and the temperature of the intermediate body M1 is set to 200° C. or more (300° C. or less), etc. In particular, when nitrous oxide is used, to make the contact resistance of the oxide conductive film 49 become a low resistance, setting is preferably performed so that the integrated value (electric power) of the radio frequency power and the etching time becomes 12 kW·sec or less (FIG. 7).

After the nitride film forming step, the contact holes 58 are formed in the silicon nitride film 50, and by forming and patterning the oxide conductive film 49, etc., including the contact holes 58, the pixel electrodes 37 having predetermined shapes are formed on the silicon nitride film 50 as shown in FIG. 1.

According to the embodiment described above, by modifying the state of the surface of the oxide conductive film 49 by cleaning the oxide conductive film 49 by plasma discharge without being reduced, the adhesion of the silicon nitride film 50 with respect to the oxide conductive film 49 can be improved without moisture absorption into the oxide conductive film 49 and the insulating film layer 48 that are weak in terms of moisture, and by forming the silicon nitride film 50 so as to cover the recesses 55 formed by scraping the insulating film layer 48, the adhesion of the silicon nitride film 50 with respect to the oxide conductive film 49 can be improved by the anchoring effect at the positions of the recesses 55. Therefore, without deteriorating the reliability, the oxide conductive film 49 and the silicon nitride film 50 on the oxide conductive film 49 can be effectively prevented from peeling, and the yield can be improved.

In the surface treatment step, the surface treatment of the oxide conductive film 49 and scraping of the insulating film layer 48 are performed by plasma discharge, so that subsequent to the surface treatment step, by forming the silicon nitride film 50 by plasma CVD, the surface treatment step and the nitride film forming step can be realized in a series of steps by using the same plasma CVD apparatus.

That is, for example, it is also possible that the recesses are formed by plasma asher or dry etching such as RIS and RIE instead of plasma CVD, however, an apparatus for performing these treatments is generally different from plasma CVD apparatuses, so that the intermediate body M1 in which the oxide conductive film 49 was formed is temporarily moved into etching equipment, and after the surface treatment is applied thereto, the intermediate body M1 is moved into the plasma CVD apparatus and the silicon nitride film 50 is formed. On the other hand, according to the present embodiment, it becomes possible to successively perform the surface treatment step and the nitride film forming step with one plasma CVD apparatus, and without needing addition of complicated processes, the lengthening of the tact time can be minimized, and therefore, the production efficiency can be made higher.

While the plasma asher using oxygen oxidizes and scrapes the insulating film layer 48, in the present embodiment, any of nitrous oxide ($N_2O$), argon (Ar), and nitrogen ($N_2$) is used, and in particular, argon impacts and scrapes the insulating film layer 48 without oxidizing the insulating film layer 48, so that sputter controllability is excellent, and the scraping amount can be made uniform as compared with the case where scraping is performed by oxidation reaction using oxygen, etc.

Further, by setting the scraping amount by etching of the insulating film layer 48 to 0.08 μm or less, the pixel electrode 37 to be formed on the silicon nitride film 50 can be prevented from being interrupted, so that electric characteristics are not deteriorated.

Etching in the surface treatment step can be performed in an etching time shorter than one minute, so that this etching does not greatly influence the manufacturing time.

In the embodiment described above, as the liquid crystal mode, not only the transverse electric field mode, but an arbitrary vertical electric field mode can also be applied.

The array substrate 16 can also be applied to, for example, organic EL display elements, etc.

The array substrate 16 is described as an example of the board device, however, the present invention is also applicable to any other arbitrary board device including an insulating film layer and a silicon nitride film that are laminated on a substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a board device that includes a substrate, an insulating film layer provided on the substrate, an oxide conductive film provided on portions of the insulating film layer, and a silicon nitride film provided on the oxide conductive film, comprising:

a surface treatment step in which, by plasma discharge, the oxide conductive film is cleaned without being reduced, and surface layers of the insulating film layer not covered by the oxide conductive film and portions of the insulating film layer in the regions covered by the oxide conductive film are etched to form recesses leading to portions under the oxide conductive film; and a nitride film forming step in which, successively from the surface treatment step, the silicon nitride film is formed by plasma CVD so as to cover the recesses and the oxide conductive film.

2. The method for manufacturing a board device according to claim 1, wherein
   in the surface treatment step, any gas of nitrous oxide, nitrogen, and argon is used.

3. The method for manufacturing a board device according to claim 2, wherein
   the surface treatment step is performed at a temperature of 150° C. to 300° C.

4. The method for manufacturing a board device according to claim 1, wherein
   the scraping amount of the insulating film layer by etching in the surface treatment step is 0.08 μm or less.

5. The method for manufacturing a board device according to claim 1, wherein
   the etching time in the surface treatment step is shorter than one minute.

6. The method for manufacturing a board device according to claim 1, wherein
   the insulating film layer is made of an organic substance.

7. The method for manufacturing a board device according to claim 1, wherein
   the oxide conductive film is made of ITO, and has translucency.

8. The method for manufacturing a board device according to claim 1, wherein
   the method is a method for manufacturing a board device for a liquid crystal display device.

* * * * *